United States Patent [19]

Lebailly et al.

[11] Patent Number: 5,404,272
[45] Date of Patent: Apr. 4, 1995

[54] CARRIER FOR A CARD CARRYING ELECTRONIC COMPONENTS AND OF LOW HEAT RESISTANCE

[75] Inventors: Michel Lebailly, Bollene; Jean-Claude Taverdet, Issirac, both of France

[73] Assignee: Transcal, Paris, France

[21] Appl. No.: 195,135

[22] Filed: Feb. 14, 1994

Related U.S. Application Data

[63] Continuation-in-part of Ser. No. 964,286, Oct. 21, 1992, abandoned.

[30] Foreign Application Priority Data

Oct. 24, 1991 [FR]  France ............... 91 13361

[51] Int. Cl.⁶ .................................................. H05K 7/20
[52] U.S. Cl. ........................... 361/700; 62/259.2; 165/104.33; 165/907; 257/714; 361/796
[58] Field of Search .......... 62/259.2; 428/192, 209, 428/901; 361/699–700, 701, 702, 784, 796; 165/80.4, 104.26, 104.33, 907; 257/713, 714; 174/16.3, 252, 15.2

[56] References Cited

U.S. PATENT DOCUMENTS

| | | | |
|---|---|---|---|
| 3,749,159 | 7/1973 | Meijer | 165/104.26 |
| 3,971,435 | 7/1976 | Peck | 165/78 |
| 4,118,756 | 10/1978 | Nelson | 361/385 |
| 4,120,019 | 10/1978 | Arii | 361/385 |
| 4,204,246 | 5/1980 | Arii | 361/385 |
| 4,681,656 | 7/1987 | Byrum | 156/645 |
| 4,835,598 | 5/1989 | Hisuchl | 357/72 |
| 4,941,530 | 7/1990 | Crowe | 165/104.33 |
| 4,958,257 | 9/1990 | Wenke | 361/385 |
| 5,199,165 | 4/1993 | Crawford | 29/846 |
| 5,283,715 | 2/1994 | Carlsten | 361/702 |

FOREIGN PATENT DOCUMENTS 8605942  3/1986  WIPO .................... 361/700

*Primary Examiner*—Gerald P. Tolin
*Attorney, Agent, or Firm*—Dennison, Meserole, Pollack & Scheiner

[57] ABSTRACT

A carrier for a printed circuit board or card on which electronic components are mounted, the carrier making it possible to disperse an increased quantity of heat given off by the components in the direction of an energy dissipating frame with which the carrier is in contact. The carrier comprises two flat parallel metal plates of identical perimeter defining between them a space which is entirely closed along the perimeter, the space containing a porous metallic material in contact with the plates, and being partially filled by a liquid which evaporates at the working temperature of the carrier.

8 Claims, 4 Drawing Sheets

CARRIER FOR A CARD CARRYING ELECTRONIC COMPONENTS AND OF LOW HEAT RESISTANCE

This application is a continuation-in-part of application Ser. No. 07/964,286, filed Oct. 21, 1992, now abandoned, incorporated herein by reference.

BACKGROUND OF THE INVENTION

1. Field of the Invention

The invention relates to a backing of a card carrying electronic components, the backing offering low heat resistance so making it possible easily to dissipate a quantity of accumulated heat given off by the components, in the direction of a chassis which functions as a heat sink.

2. Description of Related Art

Usually, electronic components are mounted on cards comprising printed circuits which interconnect the said components. Generally, these cards are provided with electrical connection devices which make it possible to plug them into open or closed metal chassis (or racks) to form a casing, using likewise metal tracks on which they run. They are obviously electrically insulating but are sufficiently good conductors of heat.

When the components are giving off heat, this must be dissipated so that they are not damaged. The temperature which must not be exceeded is approx. 125° C. in order to avoid any increase in the breakdown risk level (more generally known by the term "mean time between failure" or "MTBF").

When the cards are of epoxy resin or a glass fibre/epoxy resin complex or any other similar material which is not a good conductor of heat, the heat may be dissipated by means of thermal drains which link the components with the card supporting tracks or slides, the tracks being rigid with the chassis which acts as a heat sink or radiator.

Such a device is inadequate when the quantities of heat to be dissipated increase. Therefore, it has been suggested to use cards of a more elaborate construction. Usually, these cards comprise two parallel and flat outer plates constituting two printed circuit boards proper or two ceramic inter-connecting circuits (which will hereinafter be referred to likewise by the term 'printed board') on which the electronic components are mounted; they enclose a likewise flat metallic carrier which is a good conductor of heat.

Printed circuit boards are electrically insulating but must however offer an acceptable level of heat conductivity. Therefore, thin sheets of sintered alumina are usually chosen as the raw material for printed circuit boards while as a carrier material, the choice falls to co-laminated metal sandwiches of the Cu—invar—Cu or Cu—Mo—Cu type, which have the same expansion coefficient as the alumina.

The heat dissipation capacity of this device may be enhanced by causing a cooling fluid to circulate through the metallic carrier. But this means that, over and above the electrical connection means for the printed circuit board, it is necessary to provide hydraulic connecting means for the cooling circuits between the metallic carrier of the card or circuit board and the chassis; therefore, the hydraulic connections are mixed up with the electrical connections.

From the document IEEE 1985, National Aerospace and Electronics Conference (Vol. 2, 20th May 1985, Dayton, U.S., pp. 1244–47) it is also known to have a circuit board carrier consisting of a plurality of elementary heat conductive enclosures contained in a honeycomb-type casing closed by plates. Such a structure is not sufficiently homogeneous and may give rise to the risks of hot points due to the presence of the elements constituting the framework.

It can be seen that the amount of heat which can be dissipated is limited by the thermal resistance of the chain passing from the electronic components to the chassis, this latter obviously having sufficient capacity to dissipate whatever heat is conveyed to it.

SUMMARY OF THE INVENTION

Therefore, the Applicants have sought to diminish the thermal resistance of the printed circuit board carrier, which is an essential link in the chain; indeed, it provides the thermal link between the printed board carrying the electronic components which generate the heat, and the rails in the chassis which provide the thermal contact with the heat dissipating chassis.

They have likewise sought to achieve a greater homogeneity of temperature through the printed circuit board or card carrier in order to avoid any localized heating which might adversely affect the electronic components.

Consequently, the invention likewise has as object the provision of a printed card carrier having improved thermal characteristics which allow it to dissipate a greater flow of heat by increasing for example the power or density of the components fixed on the printed cards. The Applicants have likewise sought a printed card carrier which is easy to produce and put into service.

The invention therefore relates to a printed card carrier (or interconnection ceramic circuit) on which electronic components are mounted, the carrier making it possible to dissipate an increased volume of heat generated by the components, in the direction of an energy dissipating chassis with which it is in thermal contact and comprising a heat conductive enclosure, characterised in that it comprises two flat parallel metal plates of identical shape which define between them a single space which is closed entirely along the periphery of the plates, the space containing a porous metallic lining material which is in contact with the plates and which is partially filled with a working liquid adapted to evaporate at the operating temperature of the carrier.

Generally the printed boards are of an electrically insulating ceramic material offering the best heat conductivity. Usually, sintered alumina is used but other ceramic substances can be used, for example aluminium nitride, beryllium oxide, silicon carbide . . . Board thickness is determined in such a way that a low thermal resistance and adequate mechanical strength are simultaneously available.

The nature of the metal plates on which the printed boards are fixed is such as to offer a coefficient of expansion adapted to that of the printed card. For example, when the card is of alumina, it is advantageous to choose co-laminated copper-invar-copper or Cu—Mo—Cu plates.

The carrier according to the invention therefore usually takes the form of a parallelepiped hollow plate which is entirely and hermetically closed around its periphery and which is of minimal thickness (generally a few millimeters); the interior space which takes up the entire surface area of the plates is completely occupied by the porous metallic material which is partially filled by the liquid working solely in equilibrium with its vapor.

The way the carrier according to the invention functions can be summed up as follows. The heat given off by certain electronic components is transmitted to the liquid which is present at this location of the carrier, and it becomes vaporized; the vapor then condenses at a cold zone, while the liquid returns to the hot zone by virtue of the capillarity of the porous medium, whatever the orientation of the carrier may be.

The heat to be dissipated thus reaches the coldest areas of the carrier which are the rails in which the carrier is fitted, and thence the heat dissipating framework or chassis.

The printed card carrier according to the invention may be regarded as a single heat conductive enclosure of large horizontal dimensions and minimal vertical thickness, functioning in all the orientations.

In this, it is distinguished from the printed card carrier according to the document IEEE 1985 mentioned hereinabove, which comprises a plurality of cells which act as elementary heat conductors. Thus, the result is of the simplest conception and construction; in particular, being constituted by a single heat conductive enclosure which is not compartmented by upright members of a certain thickness, it comprises less wasted space and therefore offers improved capacity and homogeneity of heat exchange; furthermore, it only requires one single if delicate filling operation.

Thanks to the use of the latent heat of evaporation of a greater volume of working liquid, it is able to convey greater quantities of heat from the hot points to the cold points and "in fine" to the heat dissipater and likewise its operating temperature will be more uniform thanks to the absence of any upright members which define cells, the entire surface area of the carrier being one homogeneous evaporating surface.

Furthermore, it only requires a single operation to fill it with working liquid, such operations generally being delicate.

In contrast to other prior art devices, the invention does not utilize separate paths for liquid transport and gas transport, and does not utilize defined evaporation zones and condensation zones. According to the invention, substantially the entire free space between the plates is filled with the porous packing material, through which both liquid and vapor travel. The result is a greater homogeneity of the temperature in the carrier.

The invention may be put into effect in various ways.

In order to improve the rigidity of the carrier and the transfer of heat between the outer flat plates and the inner filling (porous and liquid material), it is advantageous to place spacers or cross-bars between the two plates while retaining the single space. In accordance with a particular embodiment, these spacers may be constituted by a solid or perforated metal sheet, undulating for instance in a sinusoidal form, the tips of the sinusoids being fixed (for example brazed) on the inner face of the plates, the general aspect obtained resembling corrugated cardboard, such a metal sheet occupying only a part of the single space; a structure of this type is produced by the Metal Imphy Company from Cu—invar—Cu laminates, of the Phyclad brand, the coefficient of expansion of which is advantageously adapted to the alumina-based printed boards The porous metallic material and the liquid then take their place between the sinusoids and the flat plates.

The porous metallic material may consist of a sintered metal, woven material or knitted or braided metal cord, fibre flock or metallic foam, etc. The metal may be Cu, Ni, Al, generally any metal which is a good conductor of heat. The form, the number, the dimensions of the metal threads may vary, for example: round wires or wires with a flat side, diameter 0.05 mm to 0.5 mm. What is important is that, taking into account the liquid and the metal used, the capillary pressure is sufficient that the said liquid is able to circulate in spite of the weight or negative accelerations or whatever is the orientation of the carrier, without any excessive increase in the loss of head which opposes the displacement of the vapour.

Thus, when the carrier comprises a sinusoidal spacer, braided or knitted metal cords may be incorporated into the passages in the sinusoid which are then supplemented by a transverse braid covering all the ends of the cords emerging from the said passages.

The working liquid which is used for the heat exchange generally has a boiling point below 125° C., good chemical stability and inertia, the greatest possible latent heat of evaporation, and is preferably electrically insulating. Thus, it is possible to use water, fluorocarbons or chlorofluorocarbons, certain alcohols or mixtures of liquid, for example water-methanol, etc. It is generally introduced into the carrier after having created a vacuum therein and after complete degassing in order to eliminate any trace of incondensable gas which would adversely affect the satisfactory operation of the carrier; the liquid is therefore solely in equilibrium with its vapor.

DESCRIPTION OF THE PREFERRED EMBODIMENTS

Figure 1:
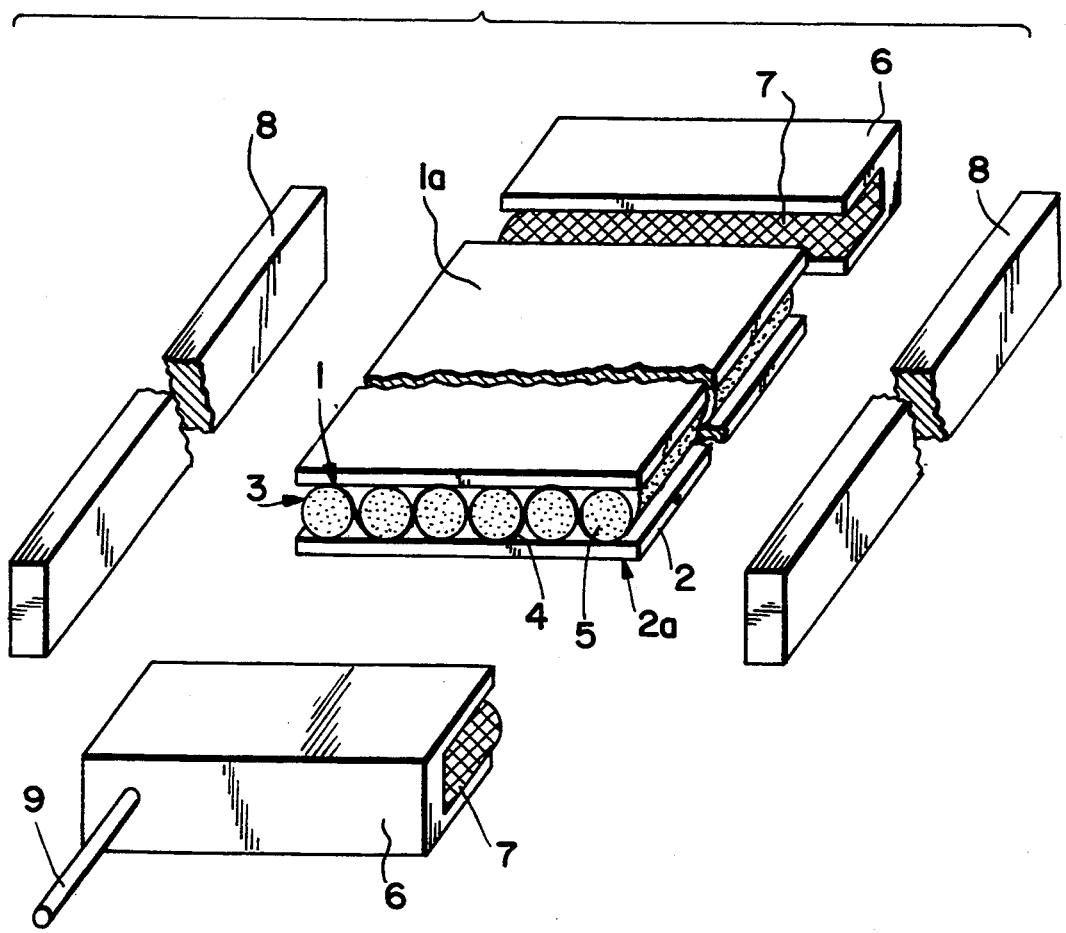
FIG. 1 is an exploded view of a carrier according to the invention.

A non-limitative embodiment is shown in FIG. 1 which is an exploded view of a flat rectangular card carrier prior to closure and of truncated length.

Figure 2:
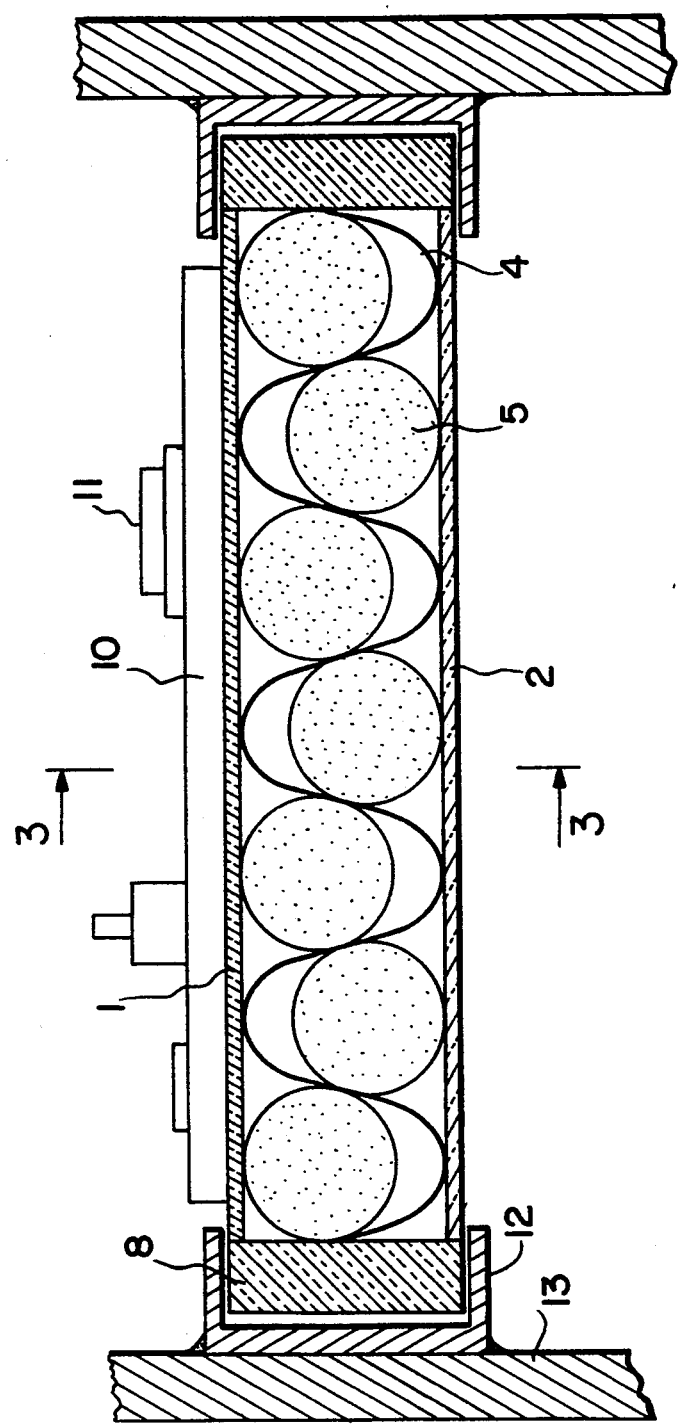
FIG. 2 is a first cross-sectional view of the carrier of FIG. 1.
Figure 3:
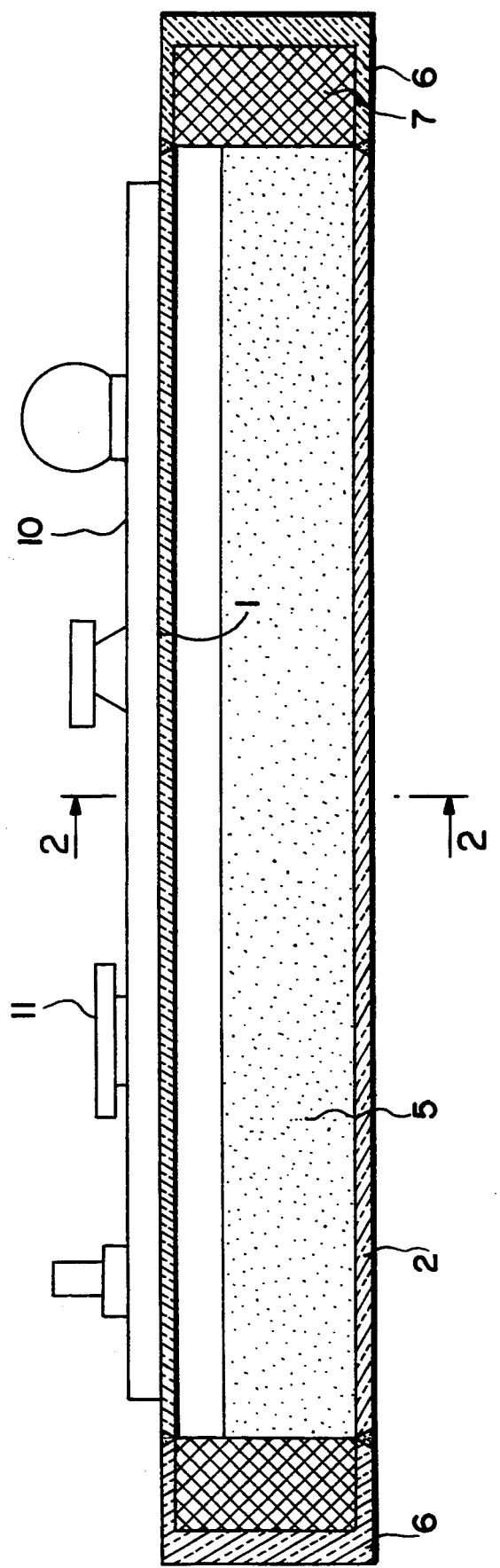
FIG. 3 is a cross-sectional view along line B—B of FIG. 2.

The same carrier can be seen in greater detail in the cross-sectional views of FIGS. 2 and 3. Reference numerals (1) and (2) respectively represent the upper and lower flat metal plates of laminated copper-invar-copper; on each of their outer flat surfaces (1a) and (2a) is fixed a printed card or circuit board (10) carrying electronic components (11). Noted in the space (3) situated between the plates (1) and (2) is a spacer (4) which is a sinusoidally undulating solid sheet of which the tops are fixed to the inside faces of the plates (1) and (2). In this embodiment, the sinusoidal cross-section of the spacer plate is at right-angles to the major axis of the rectangle formed by the plates (1) and (2).

Inserted into the passages formed by the sinusoidal wave and the plates (1) and (2) are braided copper metallic cords (5) which emerge at each end of the passages.

In the present case, the space (3) is closed on each of its short sides by a hollow cap (6) of the same width and thickness as the sandwich assembly formed by the plates (1) and (2) and the partition (4); the hollow stopper (6) has a U-shaped cross-section and there is also introduced into it metal flock or braid (7) which, once the stopper (6) has been plugged into the plates (1) and (2), will cover the ends of the cords (5) which extend beyond the passages in such a way as to ensure thermal continuity. The long sides of the space (3) are in turn formed by parallelepiped rods (8) which likewise occlude the edges of the U-shaped space in the caps (6). One of the caps (6) has a pipe (9) used to perform the operation of filling the space (3) with working liquid; this pipe (9) is then finally occluded.

Figure 4:
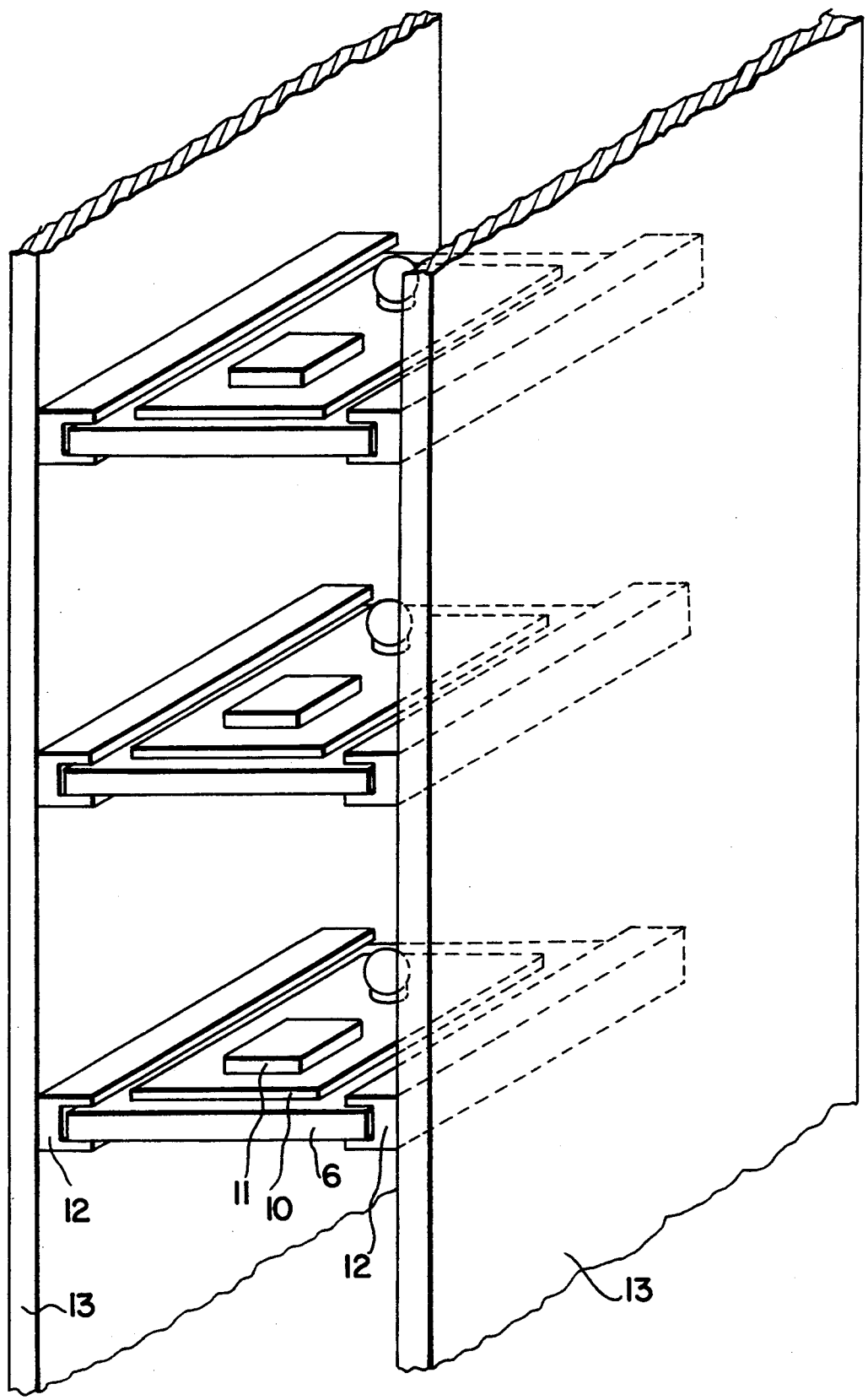
FIG. 4 is a perspective view in partial section of the carriers of the invention mounted to a frame.

As shown in FIGS. 2 and 3, a circuit board (10) is mounted on the carrier. The circuit board (10) carries electronic components (11) on the board surface opposite the board surface in contact with the carrier. The carrier is mounted between rails (12) which are secured to a frame (13). A plurality of carriers is typically secured to a frame, as shown in FIG. 4.

The circuit board or card carrier according to the invention is not limited in size and may for example be applied to the provision of carriers measuring 140 to 170 mm × 80 to 100 mm (corresponding to the ½ ATR standard size). It has a remarkable overall heat conductivity rating, markedly greater (by several powers of 10) than that obtained with a carrier based solely on copper or metal cooled by a circulation of fluid, without having the drawbacks of these latter due to the hydraulic connections which are tricky to implement. Thus, it makes it possible without any problem to disperse powers attaining 5 to 6 W/sq.cm everywhere over the surface of the carrier.

Thanks to its manner of operation, it likewise achieves a homogeneous distribution of temperature throughout the carrier and eliminates any hot points which are prejudicial to the attainment of a low mean time between failure of the printed card and its components.

Similarly, its coefficient of expansion can be adapted to that of the printed card by the choice of materials from which it is made.

By a judicious choice of the materials used for filling the enclosed space (a porous metallic material and working liquid), it is possible to vary and adapt to requirements the overall heat conductivity of the carrier.

Particularly by virtue of the appropriate capillarity of the porous material, the concept of filling the enclosed space allows the carrier to function not only in all the orientations as has already been stated but also under negative accelerations: this makes it particularly suitable for use for electronic equipment which provides power for transport means, inter alia aircraft, and furthermore its simplicity in operation, positioning and use, its lightness in relation to solid metal carriers, its compactness which is identical to that of a conventional carrier, are important factors in its favor.

What is claimed is:

1. A carrier supporting a printed circuit board on which electronic components are mounted, the carrier being capable of improved dissipation of heat generated by the components in operation in the direction of an energy dissipating frame with which the carrier is in contact, the carrier comprising two parallel flat metal plates of identical shape, separated by a predetermined distance to define therebetween a single space, means sealing the space along the periphery of said plates, a porous, metallic packing material occupying substantially the entire space between said plates and in contact with said plates, and a liquid partially filling the space which is capable of evaporation at the temperature of the space when the components are in operation and which is in equilibrium with its vapor, at least one of said metal plates having mounted on an external surface thereof the printed circuit board, which carries electronic components on a board surface opposite to a board surface mounted on the one of said metal plates.

2. A carrier according to claim 1, wherein said carrier is supported by rails rigid with the frame, said frame acting as a heat sink.

3. A carrier according to claim 1, additionally comprising means for separating the flat plates disposed in the single space between the plates.

4. A carrier according to claim 3, wherein the separating means comprises an undulating solid metal sheet of sinusoidal form which occupies only a part of the single space.

5. A carrier according to claim 1, wherein the printed circuit board comprises sintered alumina, and said plates comprise a Cu-invar-Cu laminate.

6. A carrier according to claim 1, wherein the porous material is selected from the group consisting of a sintered metal, a woven material, fibre flock, foam or metal cords.

7. A carrier supporting a printed circuit board on which electronic components are mounted, the carrier being capable of improved dissipation of heat generated by the components in operation in the direction of an energy dissipating frame with which the carrier is in contact, the carrier comprising two parallel flat metal plates of identical shape, separated by a predetermined distance to define therebetween a single space, means sealing the space along the periphery of said plates, a porous, metallic packing material occupying substantially the entire space between said plates and in contact with said plates, and a liquid partially filling the space which is capable of evaporating to a vapor phase at the temperature of the space when the components are in operation, the porous metallic packing material being partially filled by the liquid in equilibrium with the vapor phase, the liquid having a capillary pressure sufficient to circulate the liquid in the porous, metallic packing material, without increase in head loss sufficient to oppose displacement of the vapor, wherein said carrier is supported by rails rigid with the frame, said frame acting as a heat sink, and further wherein said means sealing the space comprises bars which are fitted in said rails.

8. A carrier according to claim 7, additionally comprising a printed circuit board mounted to a flat outer surface of one of said metal plates, said board carrying electronic components on a board surface opposite to a board surface in contact with said flat outer surface.

* * * * *